United States Patent
Kim et al.

(10) Patent No.: US 10,910,456 B2
(45) Date of Patent: Feb. 2, 2021

(54) ORGANIC LIGHT-EMITTING DISPLAY APPARATUS AND METHOD OF MANUFACTURING THE SAME

(71) Applicant: SAMSUNG DISPLAY CO., LTD., Yongin (KR)

(72) Inventors: Hun Kim, Yongin (KR); Hyo-Jeong Kwon, Yongin (KR); Moon-Won Chang, Yongin (KR); Won-Kyu Choe, Yongin (KR)

(73) Assignee: SAMSUNG DISPLAY CO., LTD., Yongin (KR)

( * ) Notice: Subject to any disclaimer, the term of this patent is extended or adjusted under 35 U.S.C. 154(b) by 105 days.

(21) Appl. No.: 14/584,380

(22) Filed: Dec. 29, 2014

(65) Prior Publication Data
US 2015/0349287 A1 Dec. 3, 2015

(30) Foreign Application Priority Data
May 28, 2014 (KR) .................. 10-2014-0064567

(51) Int. Cl.
*H01L 33/00* (2010.01)
*H01L 27/32* (2006.01)
*H01L 27/12* (2006.01)

(52) U.S. Cl.
CPC ...... *H01L 27/3258* (2013.01); *H01L 27/1248* (2013.01); *H01L 27/3248* (2013.01); *H01L 2251/5392* (2013.01)

(58) Field of Classification Search
CPC ............. H01L 27/3246; H01L 27/3258; H01L 27/3262

USPC .......................................................... 257/98
See application file for complete search history.

(56) References Cited

U.S. PATENT DOCUMENTS

| | | | | |
|---|---|---|---|---|
| 4,821,092 A * | 4/1989 | Noguchi | ............... | G02F 1/1368 257/10 |
| 5,003,356 A * | 3/1991 | Wakai | ..................... | H01L 27/12 257/390 |
| 5,208,690 A * | 5/1993 | Hayashi | ............ | G02F 1/136227 257/347 |
| 5,550,066 A * | 8/1996 | Tang | .................... | G09G 3/3225 438/29 |
| 5,585,951 A * | 12/1996 | Noda | ................. | G02F 1/136227 349/122 |
| 5,684,365 A * | 11/1997 | Tang | ................... | H01L 27/3244 257/448 |
| 5,811,836 A * | 9/1998 | Ha | ..................... | G02F 1/136227 257/56 |

(Continued)

FOREIGN PATENT DOCUMENTS

| | | |
|---|---|---|
| JP | 2013-243094 | 12/2013 |
| KR | 10-2005-0051500 | 6/2005 |

(Continued)

*Primary Examiner* — Jay C Kim
(74) *Attorney, Agent, or Firm* — Kile Park Reed & Houtteman PLLC

(57) ABSTRACT

An organic light-emitting display apparatus includes a transistor on a substrate. The transistor includes a gate electrode, a first electrode, and a second electrode. The apparatus also includes a protective layer over the first electrode and including a first portion that contacts the second electrode, and an organic light-emitting device having a pixel electrode electrically connected to the second electrode.

14 Claims, 3 Drawing Sheets

(56) References Cited

U.S. PATENT DOCUMENTS

| | | | | |
|---|---|---|---|---|
| 5,994,157 A * | 11/1999 | Aggas | ............... | H01L 27/14658 257/E27.131 |
| 6,031,512 A * | 2/2000 | Kadota | ............ | G02F 1/133516 345/88 |
| 6,100,954 A * | 8/2000 | Kim | ................. | G02F 1/133345 257/410 |
| 6,114,184 A * | 9/2000 | Matsumoto | ........... | G02F 1/1368 257/59 |
| 6,136,624 A * | 10/2000 | Kemmochi | ....... | G02F 1/136227 438/30 |
| 6,147,451 A * | 11/2000 | Shibata | ................ | G09G 3/3225 313/506 |
| 6,163,357 A * | 12/2000 | Nakamura | .......... | G02F 1/13394 349/151 |
| 6,219,114 B1 * | 4/2001 | Lyu | ....................... | G02F 1/1368 349/139 |
| 6,320,224 B1 * | 11/2001 | Zhang | ............... | G02F 1/136213 257/347 |
| 6,330,044 B1 * | 12/2001 | Murade | ............ | G02F 1/133512 349/44 |
| 6,380,006 B2 * | 4/2002 | Kido | ........................ | G03F 7/40 257/E21.314 |
| 6,433,851 B2 * | 8/2002 | Shimada | .................... | 349/138 |
| 6,538,374 B2 * | 3/2003 | Hosokawa | ......... | H01L 51/5206 313/504 |
| 6,599,783 B2 * | 7/2003 | Takatoku | ................ | H01L 27/12 257/E21.413 |
| 6,608,449 B2 * | 8/2003 | Fukunaga | ........... | H01L 27/3244 313/494 |
| 6,614,174 B1 * | 9/2003 | Urabe | .................. | H01L 27/3246 313/504 |
| 6,717,359 B2 * | 4/2004 | Kimura | ............... | H01L 51/5281 313/498 |
| 6,762,803 B1 * | 7/2004 | Koide | .................... | G02F 1/1362 349/138 |
| 6,893,887 B2 * | 5/2005 | Yamagata | ........... | H01L 27/3244 438/22 |
| 6,905,907 B2 * | 6/2005 | Konuma | ............ | H01L 27/3244 257/E21.243 |
| 6,911,774 B2 * | 6/2005 | Arakawa | ........... | H01L 51/5281 313/504 |
| 6,960,786 B2 * | 11/2005 | Yamazaki | ........... | H01L 27/3244 257/59 |
| 7,211,828 B2 * | 5/2007 | Yamazaki | ........... | H01L 21/6835 257/79 |
| 7,236,220 B2 * | 6/2007 | Kim | ................... | G02F 1/136209 257/E27.111 |
| 7,265,384 B2 * | 9/2007 | Oh | ..................... | H01L 29/78675 257/344 |
| 7,279,715 B2 * | 10/2007 | Park | .................... | H01L 27/3253 257/79 |
| 7,291,970 B2 * | 11/2007 | Kuwabara | ........... | H01L 27/3246 313/504 |
| 7,339,317 B2 * | 3/2008 | Yamazaki | ........... | H01L 27/3211 313/506 |
| 7,391,493 B2 * | 6/2008 | Kim | ....................... | G02F 1/1339 349/106 |
| 7,488,986 B2 * | 2/2009 | Yamazaki | ........... | H01L 51/5215 257/40 |
| 7,505,098 B2 * | 3/2009 | Nakamura | ......... | G02F 1/133555 349/114 |
| 7,531,834 B2 * | 5/2009 | Lee | ..................... | H01L 27/3246 257/103 |
| 7,550,774 B2 * | 6/2009 | Inoue | .................. | H01L 27/3253 257/184 |
| 7,586,123 B2 * | 9/2009 | Choi | .................. | H01L 27/1288 257/223 |
| 7,586,555 B2 * | 9/2009 | Lee | .................... | G02F 1/13394 349/106 |
| 7,646,143 B2 * | 1/2010 | Kimura | ............... | H01L 51/5268 313/501 |
| 7,648,865 B1 * | 1/2010 | Yang | ..................... | H01L 27/1288 257/E21.001 |
| 7,663,310 B2 * | 2/2010 | Lee | ..................... | H01L 27/3244 313/506 |
| 7,816,159 B2 * | 10/2010 | Fang | ..................... | H01L 27/1255 257/E21.002 |
| 7,846,784 B2 * | 12/2010 | Kim | ................... | H01L 29/41733 438/149 |
| 7,859,606 B2 * | 12/2010 | Higaki | .................... | H01L 27/12 349/46 |
| 8,004,184 B2 * | 8/2011 | Han | ..................... | H01L 51/5256 313/506 |
| 8,040,059 B2 * | 10/2011 | Imai | .................... | H01L 27/3258 313/506 |
| 8,053,981 B2 * | 11/2011 | Chan | ..................... | H01L 27/3246 313/483 |
| 8,062,695 B2 * | 11/2011 | Matsuda | .............. | H01L 27/3244 156/272.8 |
| 8,093,585 B2 * | 1/2012 | Nishimura | .......... | H01L 27/3262 257/347 |
| 8,183,099 B2 * | 5/2012 | Sakata | .............. | H01L 21/02565 257/59 |
| 8,237,358 B2 | 8/2012 | Pang | | |
| 8,344,362 B2 * | 1/2013 | Kitabayashi | .......... | H01L 27/326 257/40 |
| 8,421,337 B2 | 4/2013 | Suh et al. | | |
| 8,441,178 B2 | 5/2013 | Choi | | |
| 8,445,915 B2 * | 5/2013 | You | ..................... | H01L 27/3248 257/449 |
| 8,487,310 B2 * | 7/2013 | Kang | .................. | H01L 27/1248 257/59 |
| 8,487,395 B2 * | 7/2013 | Kanegae | ........... | H01L 27/3248 257/448 |
| 8,507,928 B2 * | 8/2013 | Uchida | ............... | H01L 27/3246 257/89 |
| 8,519,385 B2 * | 8/2013 | Lim | .................... | H01L 51/5209 257/40 |
| 8,569,950 B2 * | 10/2013 | Joo | ...................... | H01L 51/5237 313/498 |
| 8,593,059 B2 * | 11/2013 | Tanaka | ................ | H01L 27/3204 313/504 |
| 8,598,581 B2 * | 12/2013 | Kim | ................... | H01L 29/78633 257/59 |
| 8,624,290 B2 * | 1/2014 | Hirai | .................... | H01L 27/3246 257/103 |
| 8,629,960 B2 * | 1/2014 | Moriwaki | ......... | G02F 1/136227 349/122 |
| 8,674,366 B2 * | 3/2014 | Suzawa | ............... | H01L 27/3258 257/72 |
| 8,704,236 B2 | 4/2014 | You et al. | | |
| 8,785,937 B2 * | 7/2014 | Lee | ....................... | H01L 27/124 257/59 |
| 8,822,982 B2 * | 9/2014 | Yamazaki | ........... | H01L 21/6835 257/40 |
| 9,046,955 B1 * | 6/2015 | Lee | ....................... | G06F 3/0412 |
| 9,054,230 B2 * | 6/2015 | Sakakura | .......... | H01L 29/78654 |
| 9,070,896 B2 * | 6/2015 | Kim | ......................... | H01L 51/52 |
| 9,099,409 B2 * | 8/2015 | Fujita | .................... | H01L 27/322 |
| 9,153,605 B2 * | 10/2015 | Kim | ....................... | H01L 27/124 |
| 9,190,457 B2 * | 11/2015 | Im | ........................ | H01L 27/3216 |
| 9,196,664 B2 * | 11/2015 | Kim | ....................... | H01L 27/3258 |
| 9,214,504 B2 * | 12/2015 | Sato | ....................... | G09G 3/3233 |
| 9,287,299 B2 * | 3/2016 | Kim | ....................... | H01L 27/1255 |
| 9,331,134 B2 * | 5/2016 | Tokuda | ................ | H01L 27/3265 |
| 9,349,780 B2 * | 5/2016 | Kim | ....................... | H01L 27/3258 |
| 9,366,930 B2 * | 6/2016 | Yamazaki | ........... | H05B 33/04 |
| 9,444,069 B2 * | 9/2016 | Murakami | ........... | H01L 51/525 |
| 9,502,484 B2 * | 11/2016 | Lee | ....................... | H01L 27/3258 |
| 9,767,693 B2 * | 9/2017 | Lee | ....................... | G08G 1/166 |
| 9,857,867 B2 * | 1/2018 | Kumar | ................ | G06K 9/00671 |
| 2004/0263072 A1 * | 12/2004 | Park | .................... | H01L 27/3246 313/509 |
| 2005/0116231 A1 | 6/2005 | Kang et al. | | |
| 2006/0001091 A1 * | 1/2006 | Kim | ........................ | H01L 27/12 257/347 |
| 2006/0113900 A1 * | 6/2006 | Oh | ....................... | H01L 27/3276 313/504 |

(56) References Cited

U.S. PATENT DOCUMENTS

| | | | |
|---|---|---|---|
| 2006/0125390 A1* | 6/2006 | Oh | H01L 27/3276 313/506 |
| 2007/0072439 A1* | 3/2007 | Akimoto | H01L 27/1225 438/795 |
| 2009/0195148 A1* | 8/2009 | Lee | H01L 51/5092 313/504 |
| 2010/0007271 A1* | 1/2010 | Lee | H01L 27/3246 313/504 |
| 2011/0069036 A1* | 3/2011 | Anno | G06F 3/044 345/174 |
| 2012/0075243 A1* | 3/2012 | Doi | G06F 3/044 345/174 |
| 2012/0097952 A1* | 4/2012 | Kang | H01L 27/1248 257/59 |
| 2013/0313547 A1 | 11/2013 | Nakano et al. | |
| 2014/0042394 A1* | 2/2014 | Lee | H01L 51/5203 257/40 |
| 2014/0111842 A1* | 4/2014 | Mao | G02B 26/0841 359/230 |
| 2015/0179812 A1* | 6/2015 | Suzumura | H01L 29/7869 257/43 |

FOREIGN PATENT DOCUMENTS

| | | |
|---|---|---|
| KR | 10-0611151 | 8/2006 |
| KR | 10-0667089 B1 | 1/2007 |
| KR | 10-2007-0043550 A | 4/2007 |
| KR | 10-2008-0086201 | 9/2008 |
| KR | 10-2009-0099745 | 9/2009 |
| KR | 10-2010-0062566 | 6/2010 |
| KR | 10-2012-0034409 | 4/2012 |
| KR | 10-2013-0075141 A | 7/2013 |
| WO | WO 2012/142847 * 10/2012 | G02B 26/02 |

* cited by examiner

ORGANIC LIGHT-EMITTING DISPLAY APPARATUS AND METHOD OF MANUFACTURING THE SAME

CROSS-REFERENCE TO RELATED APPLICATION

Korean Patent Application No. 10-2014-0064567, filed on May 28, 2014, and entitled, "Organic Light-Emitting Display Apparatus and Method of Manufacturing the Same," is incorporated by reference herein in its entirety.

BACKGROUND

Field

One or more embodiments described herein relate to an organic light-emitting display apparatus and a method of manufacturing an organic light-emitting apparatus.

Description of the Related Art

An organic light-emitting display has a wide viewing angle, good contrast, and fast response time, and therefore have been used in portable electronic terminals and televisions.

Structurally, an organic light-emitting display includes a plurality of organic light-emitting devices formed on a lower substrate bonded to an upper substrate. Each light-emitting device includes an including an emission layer between opposing electrodes. At least one organic light-emitting device is provided for each pixel. The degree of light emission from each pixels is controlled by a thin film transistor (TFT), which is electrically connected to one of the electrodes. The emission layer emits light based on an electrical signal between the electrodes.

When an electrode of an organic light-emitting device contacts at least one electrode of the TFT, a dark spot or bright spot may occur. The dark or bright spot may occur when a foreign material penetrates into one of the electrodes of the light-emitting device. When this happens, the quality of the display is adversely affected.

SUMMARY

In accordance with one embodiment, an organic light-emitting display apparatus includes a substrate; a transistor on the substrate and including a gate electrode, a first electrode, and a second electrode; a protective layer over the first electrode and including a first portion that contacts the second electrode; and an organic light-emitting device having a pixel electrode electrically connected to the second electrode. The apparatus may include an insulating layer between the gate electrode and the first and second electrodes, wherein a second portion of the protective layer contacts the insulating layer. The protective layer may not be disposed in a region where the transistor is not disposed. The protective layer may include an inorganic material.

In accordance with another embodiment, an organic light-emitting display apparatus includes a substrate; a transistor on the substrate and including a gate electrode, a first electrode, and a second electrode; a first insulating layer between the gate electrode and the first and second electrodes; a first protective layer on the first insulating layer on the gate electrode, a first portion the protective layer contacting the first electrode and a second portion of the protective layer contacting the second electrode; an organic light-emitting device having a pixel electrode electrically connected to the second electrode; a second insulating layer between the transistor and the pixel electrode; and a second protective layer between the second insulating layer and the pixel electrode. The second protective layer may be on the first electrode. Each of the first and second protective layers may include an inorganic material.

In accordance with another embodiment, a method of manufacturing an organic light-emitting display apparatus includes forming a transistor on a substrate, the transistor including a gate electrode, a first electrode, and a second electrode; forming a protective layer on the first electrode, the protective layer including a first portion contacting the second electrode; and forming an organic light-emitting device having a pixel electrode electrically connected to the second electrode. The method may include forming an insulating layer between the gate electrode and the first and second electrodes. The protective layer may not be disposed in a region where the transistor is not disposed. The protective layer may include an inorganic material.

In accordance with another embodiment, a pixel includes a transistor; a light emitter separated from the transistor by a space; and at least one protective layer between the transistor and the light emitter, wherein the at least one protective layer includes a non-conductive material which contacts an electrode of the light emitter when the electrode of the light emitter moves into the space by a force, and wherein the contact between the at least one protective layer and the electrode of the light emitter blocks an electrode of the transistor from being electrically connected to the electrode of the light emitter.

The at least one protective layer may be over a predetermined number of electrodes of the transistor, and wherein the predetermined number may be less than three. A portion of the at least one protective layer may extend between source and drain electrodes of the transistor. The space may include an insulating layer which deforms when the electrode of the light emitter moves into the space. The at least one protective layer may include an inorganic material. The pixel may include a planarizing layer over the transistor and at least one protective layer.

The at least one protective layer may include a first protective layer between source and drain electrodes of the transistor, and a second protective layer spaced from the first protective layer over the transistor. The pixel may include an insulating layer between the first and second protective layers. The second protective layer may be between the first protective layer and the electrode of the light emitter.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
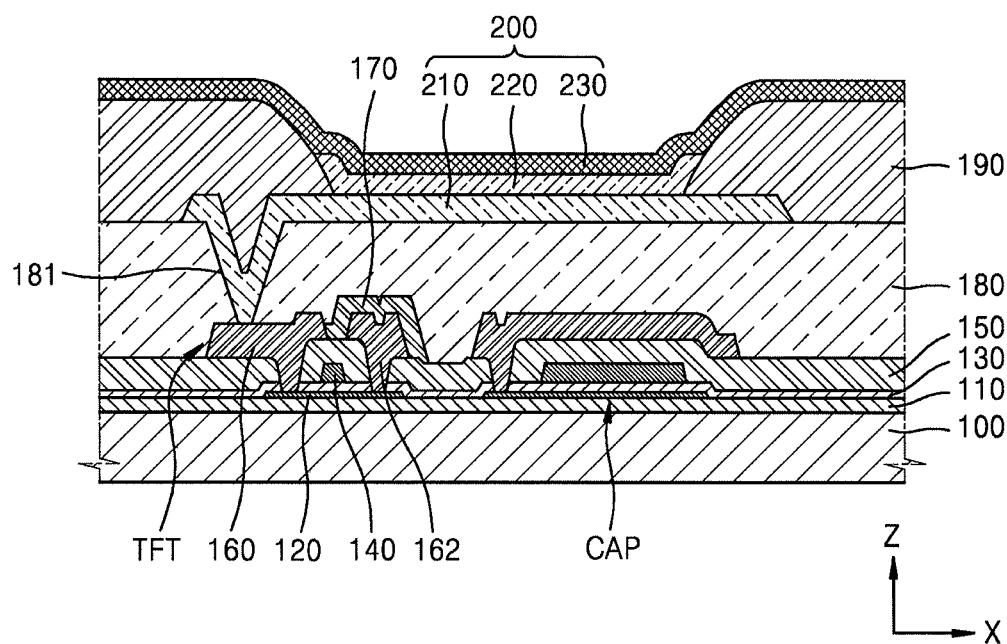
FIG. 1 illustrates an embodiment of an organic light-emitting display.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 is a cross-sectional view of one embodiment of an organic light-emitting display apparatus which includes a substrate 100, a thin film transistor (TFT) on the substrate 100, a first protective layer 170, and an organic light-emitting device 200. The substrate 100, the transistor TFT, the first protective layer 170, and the organic light-emitting device 200 may all correspond to a pixel, which may be a unit pixel or sub-pixel. A capacitor CAP is electrically connected to the transistor TFT. The capacitor may store a voltage corresponding, for example, to a gray scale value of light to be emitted from the pixel or sub-pixel.

The substrate 100 may be formed of various materials such as a glass material, a metal material, and/or a plastic material such as polyethylene terephthalate (PET), polyethylene naphthalate (PEN), or polyimide. The substrate 100 includes a display region in which a plurality of pixels are arranged, and a peripheral region adjacent to or which surrounds the display region.

The organic light-emitting device 200 is electrically connected to the TFT and is disposed on the substrate 100. The organic light-emitting device 200 may include a pixel electrode 210 that is electrically connected to the TFT.

The TFT includes a semiconductor layer 120, a gate electrode 140, a first electrode 162, and a second electrode 160. The semiconductor layer 120 include an amorphous silicon, polycrystalline silicon, an organic semiconductor material, or another material. The first electrode 162 may correspond to a source electrode and the second electrode 160 may correspond to a drain electrode of the TFT.

In order to planarize a surface of the substrate 100, and/or to prevent impurities from penetrating into the semiconductor layer 120, a buffer layer 110 formed of silicon oxide or silicon nitride may be disposed on the substrate 100. The semiconductor layer 120 may be disposed on the buffer layer 110.

The gate electrode 140 may be on the semiconductor layer 120, and the first electrode 162 may be electrically connected to the second electrode 160 based on a signal applied to the gate electrode 140. The gate electrode 140 may be formed as a single layer or multiple layers, which may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The material of the gate electrode 140 may be determined, for example, by taking into consideration the adhesiveness of an adjacent layer, the surface flatness of a stacked layer, and/or processability. In one embodiment, a gate insulating layer 130, formed, for example, of silicon oxide and/or silicon nitride, may be disposed between the semiconductor layer 120 and the gate electrode 140 in order to insulate the semiconductor layer 120 from the gate electrode 140.

A first insulating layer 150 may be on the gate electrode 140, and may serve as an interlayer insulating layer between the gate electrode 140 and the first and second electrodes 162 and 160. The first insulating layer 150 may be formed as a single layer or multiple layers, which, for example, include as silicon oxide, silicon nitride, and/or a another material.

The first electrode 162 and the second electrode 160 may be on the first insulating layer 150. The first electrode 162 may be electrically connected to the second electrode 160 through a contact hole in the first insulating layer 150 and the gate insulating layer 130. Each of the first electrode 162 and the second electrode 160 may be a single layer or multiple layers, which, for example, include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The material to be used may be determined, for example, based on conductivity.

As illustrated in FIG. 1, the first protective layer 170 covers the first electrode 162 of the TFT. In this case, at least one portion of one end of the first protective layer 170 contacts the second electrode 160, e.g., the first protective layer 170 covers the first electrode 162 (corresponding to the source electrode and/or a data line) of the TFT and is not disposed over the second electrode 160 (which corresponds to the drain electrode). Further, the first protective layer 170 may contact the first insulating layer 150, in which the TFT is not disposed. The first protective layer 170 may include, for example, an inorganic material such as silicon oxide, silicon nitride, or silicon oxynitride.

Referring to the cross-sectional view of FIG. 1, the first protective layer 170 extends in a space between the first electrode 162 (corresponding to the data line) and second electrode 160 (electrically connected to the pixel electrode 210) of the TFT. The first protective layer 170 may therefore prevent a short circuit from forming between the first electrode 162 and second electrode 160 of the TFT.

Because the first protective layer 170 covers a top surface of the first electrode 162 of the TFT, a short circuit is prevented from occurring if a force pushes the pixel electrode 210 downwardly towards the first electrode 162. This force may be created, for example, by foreign material D (see FIGS. 2 and 3) penetrating into the device. In one embodiment, the first protective layer 170 is formed of a non-conductive (e.g., inorganic or organic) material. Because organic material may be expensive, the first protective layer 170 may be formed of an inorganic material in some applications. The inorganic material may be disposed, for example, to within a predetermined or minimum range of thickness to reduce manufacturing costs.

A second insulating layer 180 may be formed on the first protective layer 170, in a space between the transistor and the pixel electrode 210. The second insulating layer 180 may serve as a planarizing and/or as an additional protective layer. For example, when the organic light-emitting device 200 is formed over the TFT, as in FIG. 1, the second insulating layer 180 may serve as a planarizing layer that planarizes a top surface over the TFT. The second insulating layer 180 may include, for example, an acryl-based organic material or benzocyclobutene (BCB). In FIG. 1, the second insulating layer 180 is a single layer, but may include multiple layers in another embodiment.

The organic light-emitting device 200 may be on the second insulating layer 180. In one embodiment, the organic light-emitting device 200 includes the pixel electrode 210, an electrode 230 opposite to the pixel electrode 210, and an intermediate layer 220.

The second insulating layer 180 may include an opening which exposes at least one of the first electrode 162 or second electrode 160 of the TFT. The pixel electrode 210 contacts one of the first electrode 162 or the second electrode 160 through the opening, and is disposed on the second insulating layer 180.

The pixel electrode 210 may be, for example, a semi-transparent electrode or a reflective electrode. When the pixel electrode 210 is a semi-transparent electrode, the pixel electrode 210 may include, for example, indium tin oxide (ITO), indium zinc oxide (IZO), zinc oxide (ZnO), indium oxide ($In_2O_3$), indium gallium oxide (IGO), and/or aluminum zinc oxide (AZO).

When the pixel electrode 210 is a reflective electrode, the pixel electrode 210 may include a reflective layer which, for example, includes Ag, Mg, Al, Pt, Pd, Au, Ni, Nd, Ir, Cr, and/or a compound thereof, and/or a layer which includes ITO, IZO, ZnO, $In_2O_3$, IGO, or AZO. In another embodiment, pixel electrode 210 may include a different material. Also, the pixel electrode 210 may have a single-layer structure or a multiple-layer structure.

A third insulating layer 190 may be on the second insulating layer 180. The third insulating layer 190 may serve as a pixel-defining layer, and may include a plurality of openings, e.g., at least one of which defines an edge or surface of the pixel electrode 210 and which exposes at least a center of the pixel electrode 210. The openings may correspond to respective sub-pixels of a pixel.

Also, as illustrated in FIG. 1, the third insulating layer 190 may increase in thickness between at least one end of the pixel electrode 210 and the opposite electrode 230, to thereby prevent an arc from occurring at the end of the pixel electrode 210. The third insulating layer 190 may include, for example, an organic material such as but not limited to polyimide.

The intermediate layer 220 may include, for example, a low-molecular weight material or a polymer material. When the intermediate layer 220 includes a low-molecular weight material, the intermediate layer 220 may be formed by stacking a hole injection layer (HIL), a hole transport layer (HTL), an emission layer (EML), an electron transport layer (ETL), and an electron injection layer (EIL) in a single structure or a complex structure. The intermediate layer 220 may include, as an available organic material, copper phthalocyanine (CuPc), N,N-Di(naphthalene-1-yl)-N,N'-diphenyl-benzidine (NPB), and/or tris-8-hydroxyquinoline aluminum (Alq3), or another material. The layers may be formed, for example, by vacuum evaporation or another method.

When the intermediate layer 220 includes a polymer material, the intermediate layer 220 may have a structure which includes an HTL and an EML. The HTL may include, for example, PEDOT and the EML may include, for example, a poly (p-phenylene vinylene) (PPV)-based polymer material and/or a polyfluorene-based polymer material. The HTL and the EML may be formed, for example, by screen printing, inkjet printing, or laser-induced thermal imaging (LITI), or another method. The intermediate layer 220 may have a structure different from that shown in FIG. 1 in another embodiment.

The electrode 230 opposes the pixel electrode 210, with layer 220 (including the EML) therebetween. The opposite electrode 230 may be disposed completely or partially over the substrate 100. In one embodiment, the opposite electrode 230 is formed as one complete body corresponding to the pixel electrode 210.

The opposite electrode 230 may be, for example, a semi-transparent electrode or a reflective electrode. When the opposite electrode 230 is a semi-transparent electrode, the opposite electrode 230 may include a layer formed of metal (e.g., Li, Ca, LiF/Ca, LiF/Al, Al, Ag, Mg, and/or a compound thereof) having a small work function and a semi-transparent conductive layer formed, for example, of ITO, IZO, ZnO, or $In_2O_3$.

When the opposite electrode 230 is a reflective electrode, the opposite electrode 230 may include a layer formed, for example, of Li, Ca, LiF/Ca, LiF/Al, Al, Ag, Mg, and/or a compound thereof. The opposite electrode 230 may have a different structure and/or may be made from a different material in another embodiment.

As described above, the first protective layer 170 in the organic light emitting display apparatus of FIG. 1 prevents a short circuit from occurring between the first and second electrodes 162 and 160 of the TFT. Moreover, a short circuit is prevented from occurring if the pixel electrode 210 is pressed down toward the first electrode 162 of the TFT due to the foreign material D (see FIGS. 2 and 3) penetrating into the device. When the pixel electrode 210 is pressed down by the foreign material D, the layer 180 may be deformed to allow the pixel electrode 210 to move into the space between the transistor and the pixel electrode 210. The first protective layer 170 may include an inorganic or organic material that is non-conductive. Because using an organic material that is non-conductive incurs high costs, forming the first protective layer 170 from an inorganic material within a minimum or predetermined thickness range may reduce manufacturing costs considerably.

Figure 2:
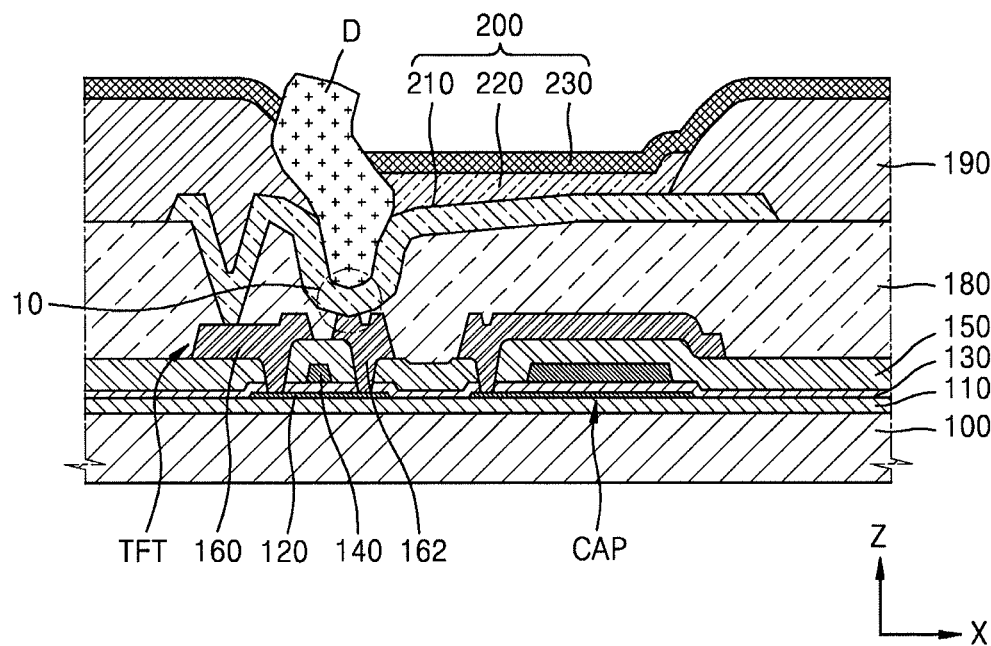
FIG. 2 illustrates an example of a foreign material that has penetrated into an organic light-emitting display having no protective layer.
Figure 3:
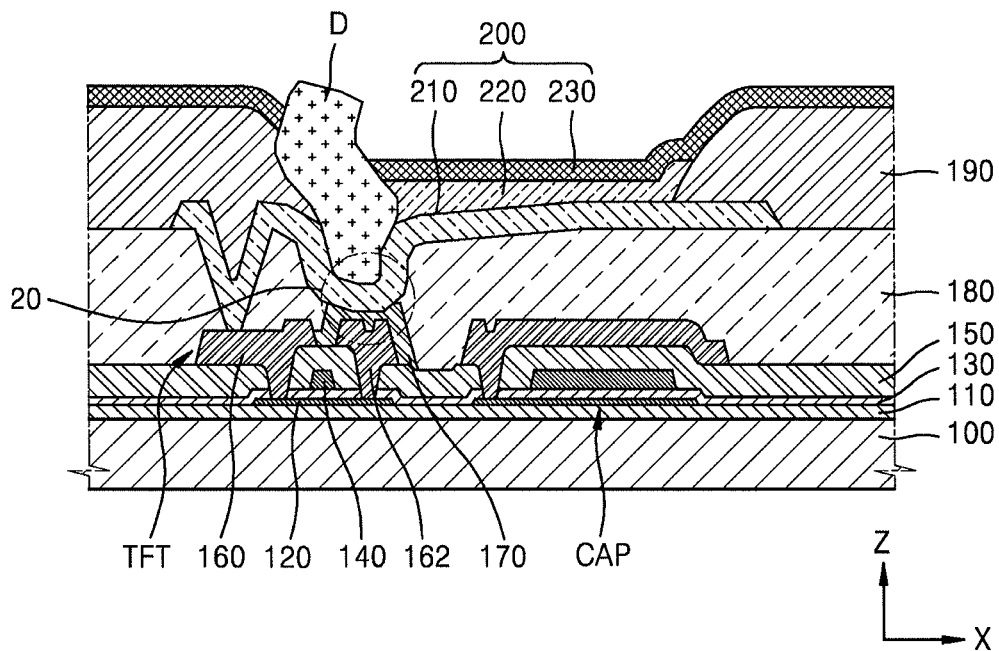
FIG. 3 illustrates an example of a foreign material that has penetrated into the organic light-emitting display of FIG. 1.

FIG. 2 illustrates a case where a foreign material D penetrates into an organic light-emitting display apparatus which does not have a protective layer. FIG. 3 illustrates the protection afforded by the protective layer (e.g., the first protective layer 170) in the device of FIG. 1.

Referring to FIG. 2, when the first protective layer 170 is not included, the second insulating layer 180 is disposed directly on the TFT. Because the second insulating layer 180 is formed of an organic material as described above, the second insulating layer 180 is vulnerable to being deformed when a foreign material penetrates into the device. When the foreign material D penetrates into the display unit, the pixel electrode 210 may contact the opposite electrode 230 due to the foreign material D. A defect may therefore occur in the form of a dark spot.

However, as illustrated in FIG. 2, when the foreign material D deeply penetrates into the display unit, a contact portion (area 10) occurs between the pixel electrode 210 and the first electrode 162, corresponding to the data line, of the TFT. As a result, a defect caused by a bright spot occurs in the pixel. Some of pixels in which the dark spot defect occurs may be determined as good pixels depending on visibility. However, all pixels in which a bright spot defect occurs may be considered to be defective pixels, which has an adverse effect on total yield rate.

Also, a case may occur in which therefore is a dark spot at an initial stage of manufacture which is changed to a bright spot, as a result of penetration of the foreign material D. This case may be described as a progressive defect, which, for example, may occur after a product is released.

In order to prevent a bright spot defect from occurring in a pixel, the first protective layer 170 may be disposed on the first electrode 162 as illustrated in FIG. 1. As illustrated in FIG. 3, the first protective layer 170 serves to protect the device when the foreign material D deeply penetrates into the display unit. For example, the first protective layer 170 prevents the pixel electrode 210 from directly contacting the first electrode 162 of the TFT at a contact portion (area 20) between the pixel electrode 210 and the TFT. The first protective layer 170, therefore, prevents a short circuit from forming, and therefore has the effect of considerably decreasing the formation of bright spot defects in a pixel.

Figure 4:
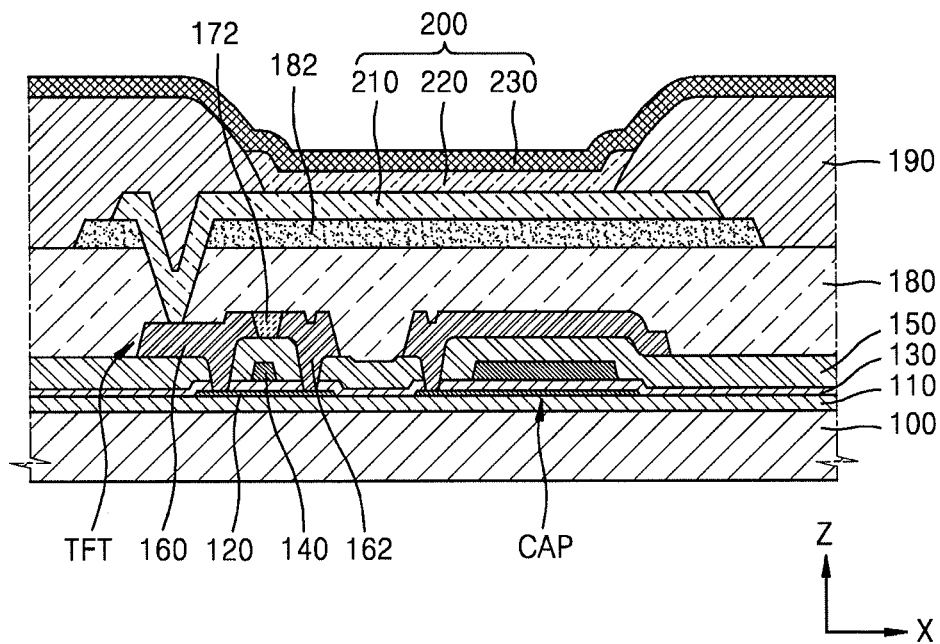
FIG. 4 illustrates another embodiment of an organic light-emitting display.

FIG. 4 illustrates another embodiment of an organic light-emitting display apparatus which includes a substrate 100, a TFT on the substrate 100, a first protective layer 172, a second protective layer 182, and an organic light-emitting device 200. The substrate 100, the transistor TFT, the first protective layer 172, the second protective layer 182, and the organic light-emitting device 200 may all correspond to a pixel, which may be a unit pixel or sub-pixel. A capacitor CAP is electrically connected to the transistor TFT. The capacitor may store a voltage corresponding, for example, to a gray scale value of light to be emitted from the pixel or sub-pixel.

The first protective layer 172 is on a first insulating layer 150, which serves as an interlayer insulating layer. The first protective layer 172 is also on the gate electrode 140 of the TFT. At least a portion of one end of the first protective layer 172 contacts a first electrode 162, and at least a portion of another end of the first protective layer 172 contacts second electrode 160. That is, the first and second electrodes 162 and 160 are spaced from one another certain interval, and the first protective layer 172 may be disposed in the space between the first and second electrodes 162 and 160. The first protective layer 172, therefore, serves to prevent a short circuit from occurring due to direct contact between the first and second electrodes 162 and 160 of the TFT.

The second protective layer 182 is between a second insulating layer 180 and the pixel electrode 210. The second protective layer 182 may be over at least the first electrode 162 of the TFT. Because the second protective layer 182 is over the first electrode 162, when the foreign material D deeply penetrates into the display unit, the second protective layer 182 prevents the pixel electrode 210 from contacting the first electrode 162. The second protective layer 182 may therefore prevent short circuits from occurring as a result of direct contact between the pixel electrode 210 and the first electrode 162, and thus may prevent a bright spot defect from occurring in a pixel.

The first and second protective layers 172 and 182 may include, for example, silicon oxide, silicon nitride, and/or silicon oxynitride. Because organic materials are expensive to use, in one embodiment the first and second protective layers 172 and 182 may include inorganic material disposed to have a predetermined or a minimum range thickness, to thereby reduce manufacturing costs. In another embodiment, the first and second protective layers may be made from an organic material.

Figure 5:
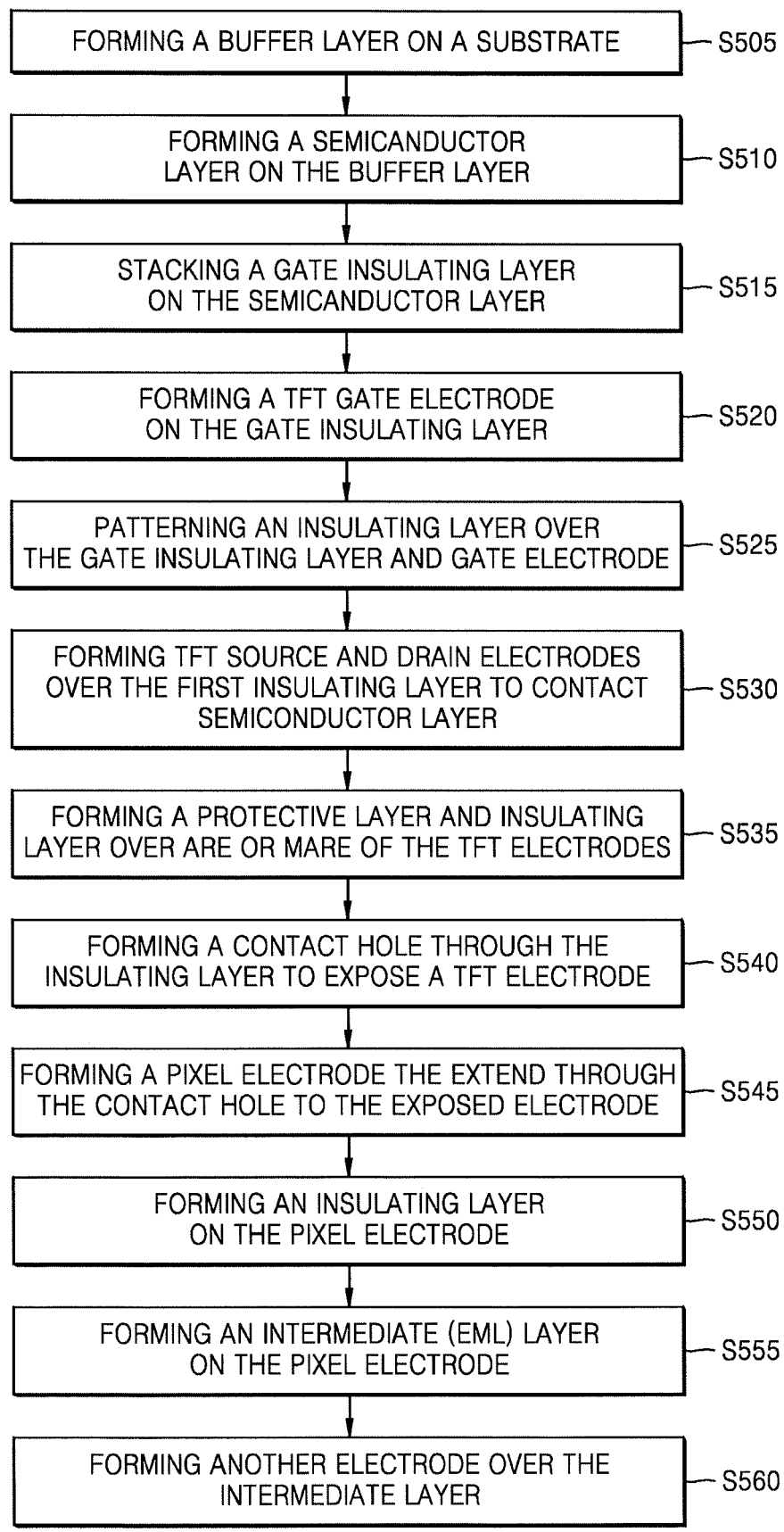
FIG. 5 illustrates an embodiment of a method for manufacturing an organic light-emitting display.

FIG. 5 illustrates operations included in one embodiment of a method for manufacturing an organic light-emitting display apparatus, which, for example, may correspond to the apparatus of FIG. 1. For illustrative purposes only, the operations of the method will be discussed relative to the apparatus in FIG. 1.

Referring to FIG. 5, the method includes forming the TFT on the substrate 100. This operation includes forming the buffer layer 110 on the substrate 100 (S505), and then performing a patterning operation to form the semiconductor layer 120 on the buffer layer 110 (S510).

After the semiconductor layer 120 is formed, a process of stacking the gate insulating layer 130 on the semiconductor layer 120 (S515), and performing a patterning operation to form the gate electrode 140 on the gate insulating layer 130 (S520). The method also includes patterning the first insulating layer 150 over the gate insulating layer 130 and the gate electrode 140 (S525), and forming the first electrode 162 corresponding to the source electrode and the second electrode 160 corresponding to the drain electrode over portions of the first insulating layer 150, at respective sides of the gate electrode 140 (S530). The first and second electrodes 162 and 160 may be formed as patterns that extend through the gate insulating layer 130 to electrically contact the semiconductor layer 120.

Subsequently, a process of stacking the first protective layer 170 and the second insulating layer 180 over the TFT is performed (S535). The first protective layer 170 may protects the TFT as previously explained. The second insulating layer 180 may protect the TFT and/or planarize the top surface of the TFT. In an alternative embodiment, only one of the first protective layer 170 or the second insulating layer 180 may be formed to protect the TFT.

Also, the first protective layer 170 may be formed over only one of the drain electrode, source electrode, or drain electrode, or over two or all of these electrodes. The first protective layer 170 may be formed directly on one or more electrodes of the TFT, or one or more intervening layers may be situated between the one or more TFT electrodes and the first protective layer 170.

The method may further include forming a contact hole through the second insulating layer 180 to expose one of the source or drain electrodes (S540). Then, the method includes forming the pixel electrode 210 over the second insulating layer 180, to be electrically connected to one of the first or second electrodes 162 and 160 of the TFT (S545). In one embodiment, the pixel electrode 210 is electrically connected to the drain electrode 160. In an alternative embodiment, the pixel electrode 210 is electrically connected to the source electrode 162.

The method further includes forming the third insulating layer 190 in a pattern on the pixel electrode 210 (S550). The third insulating layer 190 may serve as a pixel-defining layer to define a pixel. The third insulating layer 190 may be patterned to cover respective edges of the pixel electrode 210, while leaving a predetermined (e.g., central) portion of the pixel electrode 210 is exposed.

The method further includes forming the intermediate layer 220 (including the EML) on the predetermined portion of the pixel electrode 210 that is exposed by the third insulating layer 190 (S555). Subsequently, a process of forming the opposite electrode 230 corresponding to the pixel electrode 210 is performed (S560). For example, as illustrated in FIG. 5, the opposite electrode 230 may be formed all over the third insulating layer 190.

By way of summation and review, when an electrode of an organic light-emitting device contacts at least one electrode of the TFT, a dark spot or bright spot may occur. The dark or bright spot may occur when a foreign material penetrates into one of the electrodes of the light-emitting device. When this happens, the quality of the display is adversely affected. In accordance with one or more of the aforementioned embodiments, an organic light-emitting display apparatus includes at least one protective layer to prevent a pixel driving error from occurring due to penetration of a foreign material.

In at least one embodiment, an organic light-emitting display apparatus which includes a transistor, at least one protective layer over a first electrode of the transistor, and an organic light-emitting device having a pixel electrode electrically connected to a second electrode of the transistor. The at least one protective layer extends between the first and second electrodes, and prevents an electrical short from forming between the pixel electrode and one of the transistor electrodes when a foreign object applies a force which moves the pixel electrode towards the transistor. Two protective layers that are spaced from one another may also prevent this type of electrical short.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
   a substrate;
   a first insulating layer;
   a transistor on the substrate, the transistor including a gate electrode, a first electrode, and a second electrode, the first and the second electrodes are on a same layer;
   a protective layer that extends in a space between the first electrode and the second electrode of the transistor, the protective layer including a first portion over the first electrode and a second portion that extends from the first portion and contacts a side of the second electrode, the first portion of the protective layer overlapping an upper surface of the first electrode in a plan view, and the protective layer including an insulating material different from a conductive material of the first electrode;
   a second insulating layer between the gate electrode and the first and the second electrodes; and
   an organic light-emitting device having a pixel electrode electrically connected to the second electrode,
   wherein:
   the protective layer is between the first insulating layer and at least the first electrode,
   the protective layer does not overlap an upper surface of the second electrode in the plan view, and exposes an entire part of an upper surface of the second electrode,
   the pixel electrode overlaps the first and second electrodes,
   the first insulating layer is between the pixel electrode and each of the first and second electrodes, and the protective layer, an emission layer of the organic light-emitting device, and the first electrode overlap one another, and
   the first insulating layer is in direct contact with the second insulating layer in some regions that do not overlap the first electrode.

2. The apparatus as claimed in claim 1, wherein the second insulating layer covers an upper surface of the gate electrode, and the second portion of the protective layer contacts the second insulating layer.

3. The apparatus as claimed in claim 2, wherein the protective layer is not disposed in a region where the transistor is not disposed.

4. The apparatus as claimed in claim 1, wherein the protective layer includes an inorganic material.

5. The apparatus as claimed in claim 1, wherein the protective layer consists essentially of a non-conductive material.

6. The apparatus as claimed in claim 1, wherein the first and second portions of the protective layer are continuous with each other and parts of a same layer.

7. The apparatus as claimed in claim 1, wherein the protective layer encases the first electrode as viewed in a cross-sectional view.

8. The apparatus as claimed in claim 1, wherein the protective layer is a single layer completely separating the first electrode from the first insulating layer as viewed in a cross-sectional view.

9. The apparatus as claimed in claim 1, wherein the second portion of the protective layer overlaps the upper surface of the gate electrode, the second insulating layer being between the gate electrode and the second portion of the protective layer.

10. A pixel, comprising:
    a transistor including a first electrode, a second electrode, and a gate electrode;
    a first insulating layer;
    a second insulating layer on the transistor;
    a light emitter separated from the transistor; and
    a protective layer between the transistor and the light emitter,
    wherein the protective layer consists essentially of a non-conductive material, the non-conductive material of the protective layer including an inorganic material,
    wherein an electrode of the light emitter overlaps the first, second, and gate electrodes of the transistor,
    wherein the first insulating layer is interposed between the gate electrode and the first electrode, and the first insulating layer is in direct contact with the second insulating layer in some regions that do not overlap the first electrode,
    wherein the protective layer extends in a space between the first electrode and the second electrode of the transistor, the protective layer is between the second insulating layer and an upper surface of the first electrode, the protective layer overlaps the upper surface of the first electrode in a plan view, the protective layer does not overlap an upper surface of the second electrode in the plan view, and the protective layer exposes an entire part of an upper surface of the second electrode,
    wherein the electrode of the light emitter is electrically connected to the second electrode,
    wherein the protective layer, the first electrode, and the electrode of the light emitter overlap in the plan view, and
    wherein the protective layer is in contact with the upper surface of the first electrode in the plan view and covers an entire part of the upper surface of the first electrode, and the protective layer faces the second insulating layer in a cross-sectional view.

11. The pixel as claimed in claim 10, wherein the protective layer is over a predetermined number of electrodes of the transistor, and wherein the predetermined number is less than three.

12. The pixel as claimed in claim 10, wherein the first electrode is a source electrode and the second electrode is a drain electrode of the transistor.

13. The pixel as claimed in claim 10, wherein the second insulating layer deforms when the electrode of the light emitter moves.

14. The pixel as claimed in claim 10, further comprising:
a planarizing layer over the transistor and the protective layer.

* * * * *